United States Patent
Watanabe et al.

(10) Patent No.: US 9,922,940 B2
(45) Date of Patent: Mar. 20, 2018

(54) SEMICONDUCTOR DEVICE INCLUDING AIR GAPS BETWEEN INTERCONNECTS AND METHOD OF MANUFACTURING THE SAME

(71) Applicant: TOSHIBA MEMORY CORPORATION, Minato-ku (JP)

(72) Inventors: Takashi Watanabe, Yokkaichi (JP); Takeshi Arakawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/242,964

(22) Filed: Aug. 22, 2016

(65) Prior Publication Data

US 2017/0243835 A1 Aug. 24, 2017

Related U.S. Application Data

(60) Provisional application No. 62/298,269, filed on Feb. 22, 2016.

(51) Int. Cl.
| | |
|---|---|
| H01L 23/00 | (2006.01) |
| H01L 27/112 | (2006.01) |
| H01L 23/528 | (2006.01) |
| H01L 21/768 | (2006.01) |
| H01L 23/532 | (2006.01) |
| H01L 23/522 | (2006.01) |

(52) U.S. Cl.
CPC ........ *H01L 23/562* (2013.01); *H01L 21/7682* (2013.01); *H01L 21/76807* (2013.01);
(Continued)

(58) Field of Classification Search
CPC ... H01L 29/792; H01L 21/306; H01L 27/115; H01L 23/538; H01L 23/562; H01L 34/53266; H01L 23/5226; H01L 23/53295; H01L 21/76807; H01L 21/7682; H01L 21/76819; H01L 21/76877; H01L 21/76843; H01L 27/11286; H01L 23/00;
(Continued)

(56) References Cited

U.S. PATENT DOCUMENTS

| | | | |
|---|---|---|---|
| 6,960,834 B2 | 11/2005 | Nakamura et al. | |
| 8,823,079 B2 | 9/2014 | Watanabe et al. | |

(Continued)

FOREIGN PATENT DOCUMENTS

| | | |
|---|---|---|
| JP | 4102246 | 6/2008 |
| JP | 2009-123733 | 6/2009 |

(Continued)

*Primary Examiner* — Alexander Oscar Williams
(74) *Attorney, Agent, or Firm* — Oblon, McClelland Maier & Neustadt, L.L.P.

(57) ABSTRACT

A semiconductor device includes a substrate, and interconnects provided above the substrate. The device further includes a first insulator that is provided on the interconnects and on air gaps provided between the interconnects, surrounds the interconnects from lateral sides of the interconnects, and is formed of a first insulating material. The device further includes a second insulator that surrounds an interconnect region including the interconnects and the air gaps from the lateral sides of the interconnects through the first insulator, includes no portion provided between the interconnects, and is formed of a second insulating material different from the first insulating material.

9 Claims, 6 Drawing Sheets

(52) U.S. Cl.
CPC .. *H01L 21/76819* (2013.01); *H01L 21/76843* (2013.01); *H01L 21/76877* (2013.01); *H01L 23/528* (2013.01); *H01L 23/5226* (2013.01); *H01L 23/53266* (2013.01); *H01L 23/53295* (2013.01); *H01L 27/11286* (2013.01)

(58) Field of Classification Search
CPC ... H01L 27/112; H01L 23/528; H01L 21/768; H01L 23/532; H01L 23/522
USPC .................................................. 257/751, 324
See application file for complete search history.

(56) References Cited

U.S. PATENT DOCUMENTS

| | | | | |
|---|---|---|---|---|
| 2004/0119134 | A1* | 6/2004 | Goldberg | H01L 21/288 257/508 |
| 2004/0121577 | A1* | 6/2004 | Yu | H01L 21/7682 438/622 |
| 2009/0081862 | A1* | 3/2009 | Chen | H01L 21/76831 438/618 |
| 2009/0278261 | A1* | 11/2009 | Harada | H01L 21/7682 257/774 |
| 2013/0334590 | A1* | 12/2013 | Watanabe | H01L 29/792 257/324 |
| 2015/0162277 | A1* | 6/2015 | Zhang | H01L 23/5226 257/773 |
| 2015/0162278 | A1* | 6/2015 | Zhang | H01L 21/76879 257/773 |
| 2015/0228531 | A1 | 8/2015 | Tagami | |
| 2016/0064269 | A1 | 3/2016 | Hatano | |
| 2016/0247762 | A1* | 8/2016 | Watanabe | H01L 23/5283 |

FOREIGN PATENT DOCUMENTS

| | | |
|---|---|---|
| JP | 2013-258302 | 12/2013 |
| JP | 2015-167153 | 9/2015 |

* cited by examiner

SEMICONDUCTOR DEVICE INCLUDING AIR GAPS BETWEEN INTERCONNECTS AND METHOD OF MANUFACTURING THE SAME

CROSS REFERENCE TO RELATED APPLICATION

This application is based upon and claims the benefit of priority from the prior U.S. Provisional Patent Application No. 62/298,269 filed on Feb. 22, 2016, the entire contents of which are incorporated herein by reference.

FIELD

Embodiments described herein relate to a semiconductor device and a method of manufacturing the same.

BACKGROUND

In recent years, an interconnect structure of a semiconductor device has been formed by combining interconnects and air gaps in many cases to prevent increase of capacitance between the interconnects due to miniaturization of the semiconductor device. Such an interconnect structure is generally formed in the following manner. First, a conductive film is formed, and is processed by reactive ion etching (RIE) to form a plurality of interconnects from the conductive film. Next, an insulator that is inferior in filling properties is formed on these interconnects. As a result, when a distance between the interconnects is short, the insulator fails to fill gaps between the interconnects, so that the air gaps are formed between the interconnects. In general, upper portions of the air gaps become acicular shapes.

In the interconnect structure having the air gaps, the mechanical vulnerability of the semiconductor device becomes a problem. For example, shear stress acts on the interconnect structure in a chemical mechanical polishing (CMP) process performed to planarize a film on the interconnect structure. Accordingly, cracks may be generated from the acicular upper portions of the air gaps so as to cause damage to the interconnect structure. This is also true for forces acting on the interconnect structure under other situations.

DETAILED DESCRIPTION

Embodiments will now be explained with reference to the accompanying drawings.

In one embodiment, a semiconductor device includes a substrate, and interconnects provided above the substrate. The device further includes a first insulator that is provided on the interconnects and on air gaps provided between the interconnects, surrounds the interconnects from lateral sides of the interconnects, and is formed of a first insulating material. The device further includes a second insulator that surrounds an interconnect region including the interconnects and the air gaps from the lateral sides of the interconnects through the first insulator, and is formed of a second insulating material different from the first insulating material.

First Embodiment

Figure 1A:
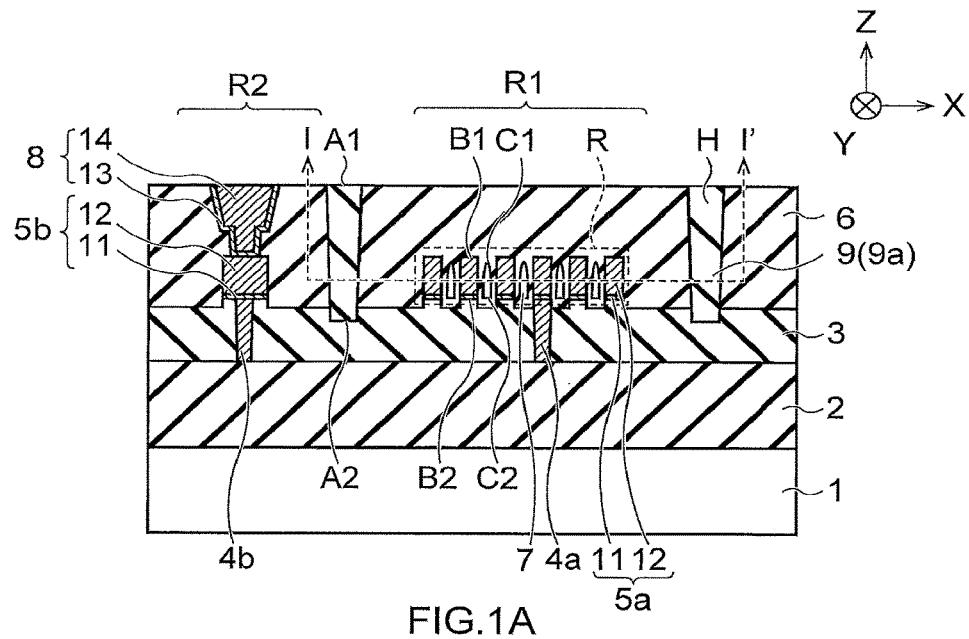
FIGS. 1A and 1B are cross-sectional views illustrating a structure of a semiconductor device of a first embodiment.
Figure 1B:
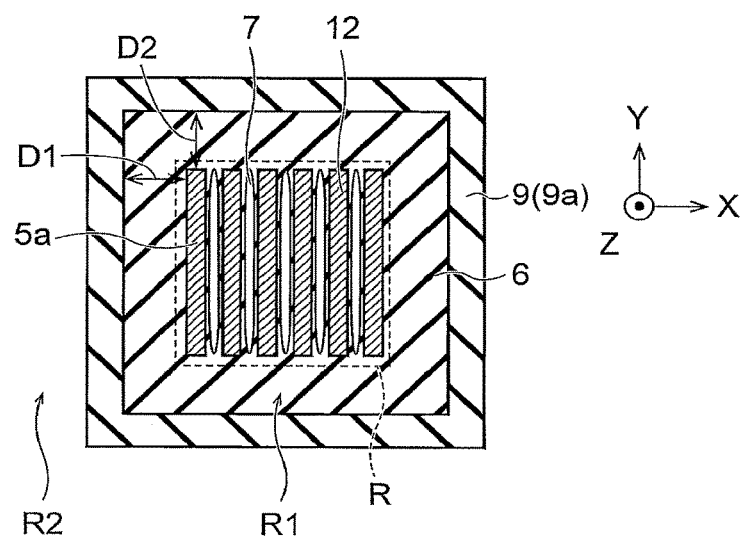

FIGS. 1A and 1B are cross-sectional views illustrating a structure of a semiconductor device of a first embodiment. FIG. 1A illustrates a vertical cross section of the semiconductor device. FIG. 1B illustrates a horizontal cross section of the semiconductor device along the line in FIG. 1A.

Hereinafter, the structure of the semiconductor device of the present embodiment will be described with reference to mainly FIG. 1A. In this description, FIG. 1B will also be referred to as appropriate.

The semiconductor device of the present embodiment includes a substrate 1, a first inter layer dielectric 2, a second inter layer dielectric 3, a first via plug 4a, a second via plug 4b, first interconnects 5a, a second interconnect 5b, a third inter layer dielectric 6, air gaps 7, a third interconnect 8 and a protective insulator 9. The third inter layer dielectric 6 is an example of a first insulator and a first film. The protective insulator 9 is an example of a second insulator and a second film. The first interconnects 5a are an example of interconnects.

The semiconductor device of the present embodiment further includes a barrier metal layer 11 and an interconnect material layer 12 that form the first and second interconnects 5a and 5b, and a barrier metal layer 13 and an interconnect material layer 14 that form the third interconnect 8.

An example of the substrate 1 includes a semiconductor substrate such as a silicon substrate. FIGS. 1A and 1B show an X direction and a Y direction that are parallel to a surface of the substrate 1 and perpendicular to each other, and a Z direction that is perpendicular to the surface of the substrate 1. In this specification, a +Z direction is treated as an upward direction and a −Z direction is treated as a downward direction. The −Z direction in the present embodiment may or may not correspond to the direction of gravitational force.

The first inter layer dielectric 2 is formed on the substrate 1. Examples of the first inter layer dielectric 2 include a silicon oxide, a silicon nitride, and a stack film containing the silicon oxide and the silicon nitride. The second inter layer dielectric 3 is formed on the first inter layer dielectric 2. An example of the second inter layer dielectric 3 includes a silicon oxide.

The first and second via plugs 4a and 4b are formed in the second inter layer dielectric 3. For example, the first and second via plugs 4a and 4b are electrically connected to semiconductor elements on the substrate 1, diffusion layers in the substrate 1 or the first inter layer dielectric 2, interconnects in the first inter layer dielectric 2 or the like (not illustrated). The first and second via plugs 4a and 4b are formed of, for example, a tungsten layer.

The first and second interconnects 5a and 5b are formed above the substrate 1, specifically on the second inter layer dielectric 3. One of the first interconnects 5a is electrically connected to the first via plug 4a. Each first interconnect 5a may be electrically connected to another unillustrated first via plug in the second inter layer dielectric 3. The second interconnect 5b is electrically connected to the second via plug 4b. The first and second interconnects 5a and 5b of the present embodiment are RIE interconnects that are formed by RIE. The first and second interconnects 5a and 5b are formed of the barrier metal layer 11 and the interconnect material layer 12 on the barrier metal layer 11. An example of the barrier metal layer 11 includes a titanium layer. An example of the interconnect material layer 12 includes a tungsten layer.

The semiconductor device of the present embodiment is a NAND flash memory. FIG. 1A shows a memory cell region R1 and a peripheral circuit region R2 on the substrate 1. The memory cell region R1 is an example of a first region. The peripheral circuit region R2 is an example of a second region. The first via plug 4a and the first interconnects 5a are formed in the memory cell region R1. The second via plug 4b and the second interconnect 5b are formed in the peripheral circuit region R2. The first interconnects 5a of the present embodiment are microscopic interconnects that are adjacent to one another in the X direction and extend in the Y direction. Specifically, the first interconnects 5a of the present embodiment are bit lines of the NAND flash memory. The first interconnects 5a of the present embodiment are electrically connected to the second interconnect 5b through the first and second via plugs 4a and 4b and the like.

The third inter layer dielectric 6 is formed on the second inter layer dielectric 3 so as to cover the first and second interconnects 5a and 5b. An example of the third inter layer dielectric 6 includes a silicon oxide. This silicon oxide is an example of a first insulating material.

The air gaps 7 are formed between the first interconnects 5a in the third inter layer dielectric 6. The upper portion of each air gap 7 has an acicular shape. The air gaps 7 of the present embodiment extend in the Y direction as similar to the first interconnects 5a. The third inter layer dielectric 6 is formed on the first interconnects 5a and the air gaps 7, and surrounds the first interconnects 5a from the lateral sides of the first interconnects 5a. In other words, the third inter layer dielectric 6 surrounds the first interconnects 5a from the horizontal direction sides.

The third interconnect 8 is formed on the second interconnect 5b in the third inter layer dielectric 6 and electrically connected to the second interconnect 5b. The third interconnect 8 of the present embodiment is a dual-damascene interconnect that is formed by a dual-damascene method. The third interconnect 8 is formed of the barrier metal layer 13 and the interconnect material layer 14 on the barrier metal layer 13. An example of the barrier metal layer 13 includes a tantalum layer. An example of the interconnect material layer 14 includes a copper layer.

The protective insulator 9 is formed in the third inter layer dielectric 6 so as to surround the memory cell region R1. The memory cell region R1 includes the first interconnects 5a and the air gaps 7 in the third inter layer dielectric 6. The protective insulator 9 surrounds an interconnect region R that includes the first interconnects 5a and the air gaps 7 from the lateral sides of the first interconnects 5a through the third inter layer dielectric 6. In other words, the protective insulator 9 surrounds the interconnect region R from the horizontal direction sides through the third inter layer dielectric 6. An example of the protective insulator 9 includes a silicon nitride. This silicon nitride is an example of a second insulating material different from the first insulating material. In the present embodiment, the Young's modulus of the protective insulator 9 is higher than the Young's modulus of the third inter layer dielectric 6.

FIG. 1A shows an upper end A1 and a lower end A2 of the protective insulator 9, upper ends B1 and lower ends B2 of the first interconnects 5a, and upper ends C1 and lower ends C2 of the air gaps 7. The height of the upper end A1 of the protective insulator 9 is set higher than the heights of the upper ends B1 of the first interconnects 5a and the heights of the upper ends C1 of the air gap 7. In addition, the height of the lower end A2 of the protective insulator 9 is set lower than the heights of the lower ends B2 of the first interconnects 5a and the heights of the lower ends C2 of the air gaps 7.

As illustrated in FIG. 1B, the protective insulator 9 of the present embodiment includes an exterior wall portion 9a that has an annular shape and surrounds the interconnect region R from the lateral sides of the first interconnects 5a (on the other hand, the protective insulator 9 in a second embodiment to be described later includes the exterior wall portion 9a and a roof portion 9b). The exterior wall portion 9a and the roof portion 9b are examples of first and second portions, respectively. The exterior wall portion 9a surrounds the interconnect region R like an exterior wall from the lateral sides of the first interconnects 5a. The exterior wall portion 9a has a quadrangular annular shape. The inner and outer circumferential faces of the exterior wall portion 9a have quadrangular planar shapes. The exterior wall portion 9a may have an annular shape other than the quadrangular annular shape, such as a hexagonal annular shape.

The dimensions of the semiconductor device of the present embodiment are set, for example, in the following manner. The width of each first interconnect 5a is 20 nm, and a pitch between the first interconnects 5a is 40 nm. The planar shape of the second interconnect 5b is a regular tetragon, each side of which is 50 nm long. The thickness of the first and second interconnects 5a and 5b is 60 nm. The thickness of the third inter layer dielectric 6 is 130 nm. The width of the third interconnect 8 is 80 nm, and the thickness of the third interconnect 8 is 70 nm. The width of the upper end A1 of the exterior wall portion 9a is 38 nm, and the distance between the upper end A1 and the lower end A2 of the exterior wall portion 9a is 145 nm.

FIG. 1B shows a distance D1 between the X-directional side face of the outermost first interconnect 5a in the interconnect region R and the X-directional side face of the protective insulator 9, and a distance D2 between the Y-directional side face of the outermost first interconnect 5a in the interconnect region R and the Y-directional side face of the protective insulator 9. In the present embodiment, the minimum distance between the side face of the outermost first interconnect 5a in the interconnect region R and the side face of the protective insulator 9 is set to 100 μm or less. Accordingly, at least one of the minimum value of the distance D1 and the minimum value of the distance D2 is 100 μm or less. An example of the above minimum distance is 70 μm.

Although the protective insulator 9 in FIG. 1B surrounds six first interconnects 5a, the number of the first interconnects 5a surrounded by the protective insulator 9 may be other than six. For example, when the first interconnects 5a are the bit lines, the protective insulator 9 may surround all the bit lines above the substrate 1. In this case, the number of the surrounded first interconnects 5a is larger than the number shown in FIG. 1B, and the length of each surrounded first interconnect 5a is greater than the length shown in FIG. 1B. In addition, the planar shape of the inner circumferential face of the exterior wall portion 9a in this case is, for example, a rectangle that has a side length along the X direction of 4 mm and a side length along the Y direction of 5 mm.

The protective insulator 9 of the present embodiment is formed by forming a trench H having an annular shape in the second inter layer dielectric 6, and embedding the protective insulator 9 in the trench H (FIG. 1A). Details on a method of forming the protective insulator 9 will be described later.

In general, the Young's modulus of silicon oxide is 70 to 100 GPa, whereas the Young's modulus of silicon nitride is 240 to 300 GPa. Accordingly, in the present embodiment, the Young's modulus of the protective insulator 9 is higher than the Young's modulus of the third inter layer dielectric 6.

The protective insulator 9 may be an insulator other than a silicon nitride. Examples of such an insulator include a silicon carbide (Young's modulus: 160 GPa), an aluminum oxide (Young's modulus: 360 GPa) and an aluminum nitride (Young's modulus: 320 GPa). The Young's moduli of them are all higher than the Young's modulus of silicon oxide.

The above mentioned dimensions and materials are examples only, and the semiconductor device of the present embodiment may be configured by applying dimensions and materials other than those mentioned above.

FIGS. 2A to 3B are cross-sectional views illustrating a method of manufacturing the semiconductor device of the first embodiment. In FIGS. 2A to 3B, the substrate 1 and the first inter layer dielectric 2 are excluded from the illustrations.

Figure 2A:
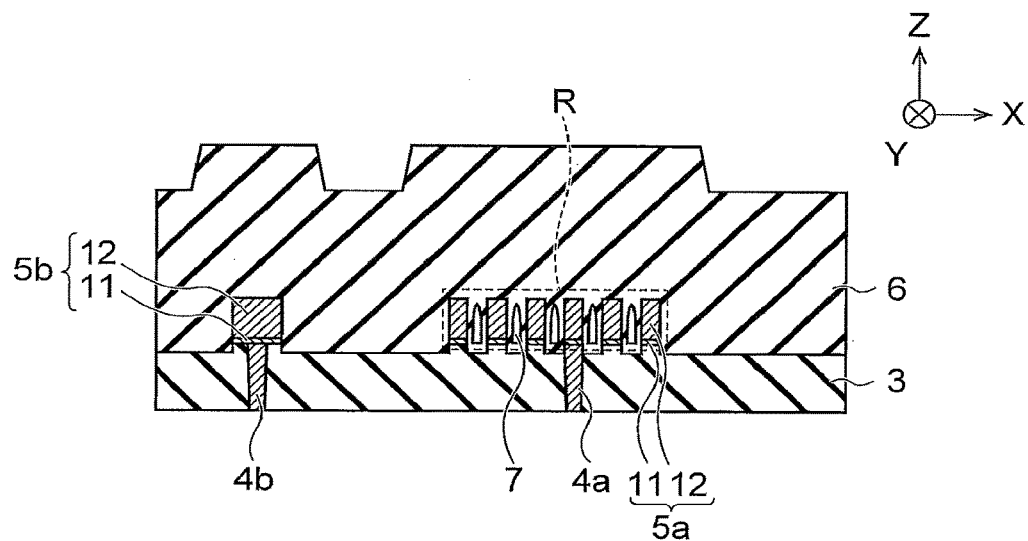
FIGS. 2A to 3B are cross-sectional views illustrating a method of manufacturing the semiconductor device of the first embodiment.

First, the first and second inter layer dielectrics 2 and 3 are sequentially formed on the substrate 1, and the first and second via plugs 4a and 4b are formed in the second inter layer dielectric 3 (FIG. 2A). Next, the first and second interconnects 5a and 5b are formed on the second inter layer dielectric 3 (FIG. 2A). The first and second interconnects 5a and 5b are formed by sequentially forming the barrier metal layer 11 and the interconnect material layer 12 on the second inter layer dielectric 3, and processing the barrier metal layer 11 and the interconnect material layer 12 by RIE.

Next, the third inter layer dielectric 6 is formed on the second inter layer dielectric 3 so as to cover the first and second interconnects 5a and 5b (FIG. 2A). In the present embodiment, the distance between first interconnects 5a is set to be short, and the third inter layer dielectric 6 is formed under the condition of inferior filling properties. As a result, the third inter layer dielectric 6 fails to fill the gaps between the first interconnects 5a, so that the air gaps 7 are formed between the first interconnects 5a. An example of the third inter layer dielectric 6 includes a silicon oxide. The third inter layer dielectric 6 is formed so as to surround the first interconnects 5a from the lateral sides of the first interconnects 5a.

Figure 2B:
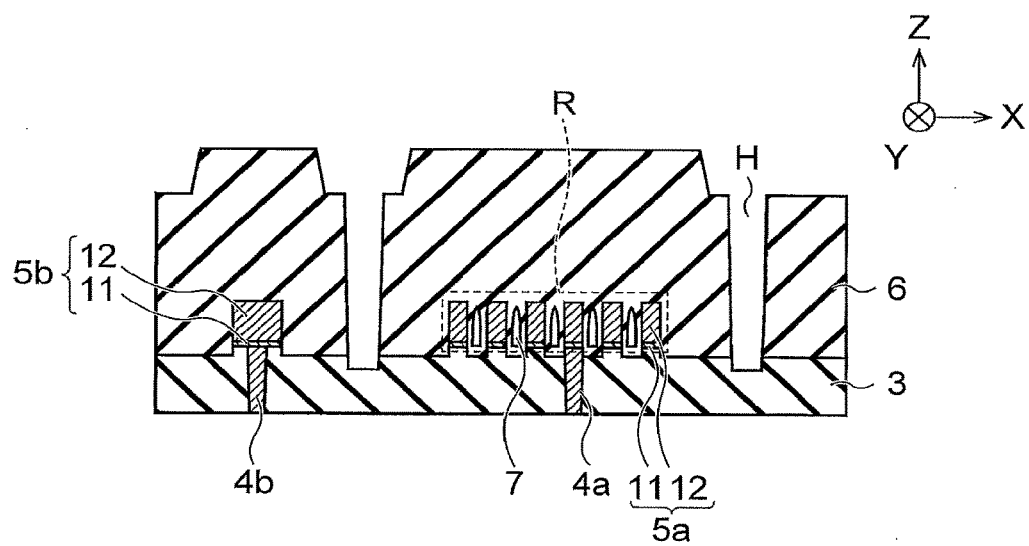

Next, the trench H is formed in the third inter layer dielectric 6 by RIE so as to surround the interconnect region R that includes the first interconnects 5a and the air gaps 7 (FIG. 2B). The trench H of the present embodiment is processed into a quadrangular annular shape. In addition, the trench H of the present embodiment is formed so that the bottom surface of the trench H is lower than the lower ends B2 of the first interconnects 5a and the lower ends C2 of the air gaps 7. The width of the trench H is set to, for example, 40 nm. The depth of the trench H is set to, for example, 170 nm.

Figure 3A:
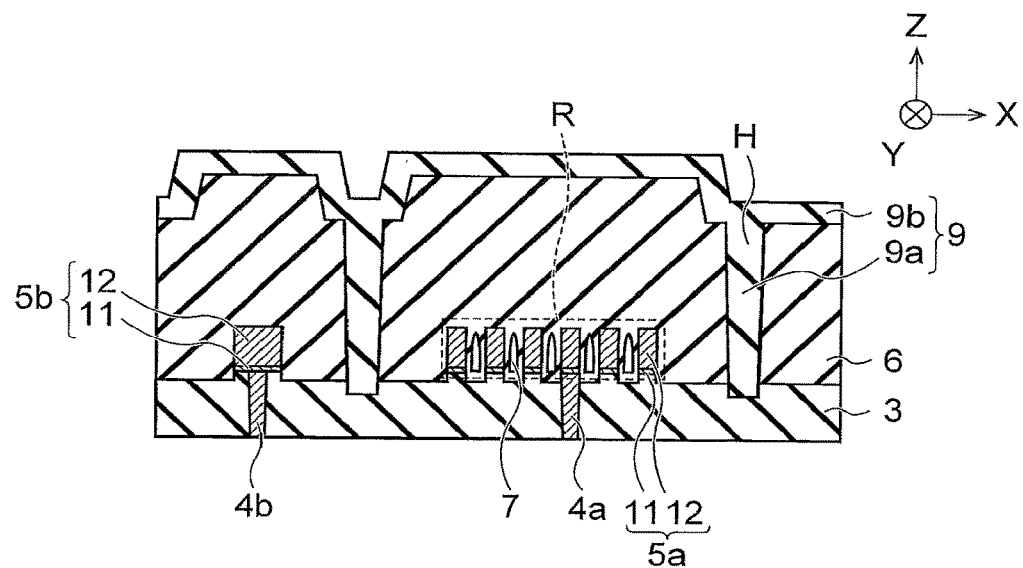

Next, the protective insulator 9 is formed on the third inter layer dielectric 6 (FIG. 3A). As a result, the protective insulator 9 is formed so as to include the exterior wall portion 9a embedded in the trench H, and the roof portion 9b on the upper surface of the third inter layer dielectric 6. The exterior wall portion 9a surrounds the interconnect region R from the lateral sides of the first interconnects 5a through the third inter layer dielectric 6. The roof portion 9b is formed above the interconnect region R through the third inter layer dielectric 6. An example of the protective insulator 9 includes a silicon nitride. The thickness of the protective insulator 9 is set to, for example, 25 nm.

Figure 3B:
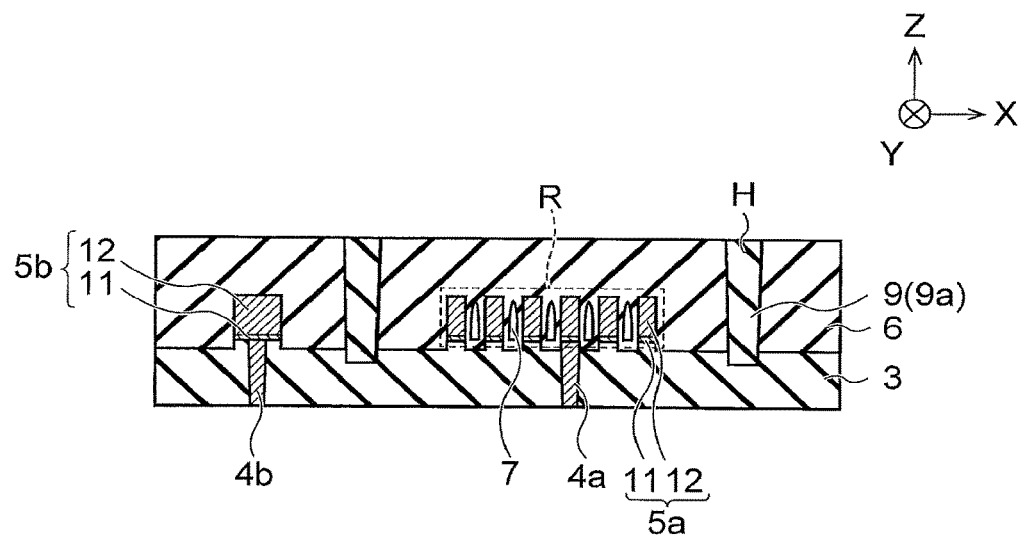

Next, the third inter layer dielectric 6 and the protective insulator 9 are polished by chemical mechanical polishing to planarize surfaces of the third inter layer dielectric 6 and the protective insulator 9 (FIG. 3B). As a result, the roof portion 9b of the protective insulator 9 is removed.

Thereafter, the third inter layer dielectric 6 is processed by RIE to form a via hole and an interconnect trench on the second interconnect 5b. Next, the barrier metal layer 13 is formed on the bottom and side faces of the via hole and the interconnect trench by sputtering, the interconnect material layer 14 is formed in the via hole and the interconnect trench by plating, and portions of the barrier metal layer 13 and the interconnect material layer 14 outside the via hole and the interconnect trench are removed by CMP. As a result, the third interconnect 8 that is a dual-damascene interconnect is formed on the second interconnect 5b (FIG. 1A). The third interconnect 8 is electrically connected to the second interconnect 5b through the via hole. The barrier metal layer 13 and the interconnect material layer 14 are an example of a film above the substrate and a third film. In this way, the semiconductor device of the present embodiment is manufactured.

Figure 4:
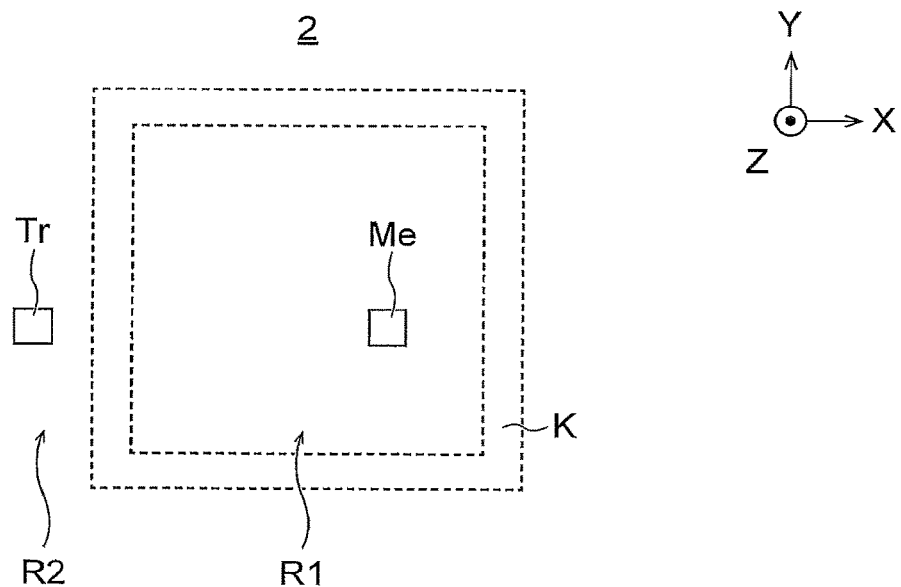
FIG. 4 is a plan view schematically illustrating the structure of the semiconductor device of the first embodiment.

FIG. 4 is a plan view schematically illustrating the structure of the semiconductor device of the first embodiment.

FIG. 4 represents a horizontal cross section of the first inter layer dielectric 2. Reference character K denotes a region that overlaps with the exterior wall portion 9a in the Z direction. In other words, reference character K denotes a region that is positioned in the vertical direction of the exterior wall portion 9a. Since the memory cell region R1 is located in a position that overlaps with the inner region of the exterior wall portion 9a in the Z direction, the memory cell region R1 is located inside the region K. Since the peripheral circuit region R2 is located in a position that overlaps with the outer region of the exterior wall portion 9a in the Z direction, the peripheral circuit region R2 is located outside the region K.

The semiconductor device of the present embodiment includes a semiconductor element such as a memory cell Me in the memory cell region R1, and a semiconductor element such as a peripheral transistor Tr in the peripheral circuit region R2. In addition, the semiconductor device of the present embodiment includes an interconnect such as the first interconnects 5a in the memory cell region R1, and an interconnect such as the second interconnect 5b in the peripheral circuit region R2. In other words, the semiconductor device of the present embodiment includes the elements and the interconnects not only inside the region K but also outside the region K. The reason for this is that the exterior wall portion 9a of the present embodiment is disposed not in the vicinity of the outer circumference of the chip of the semiconductor device but away from the outer circumference of the chip of the semiconductor device.

Hereinafter, details on the semiconductor device of the present embodiment will be described with reference to FIGS. 1A and 1B.

In the present embodiment, CMP processes are carried out when surfaces of the third inter layer dielectric 6 and the protective insulator 9 are planarized and when portions of the barrier metal layer 13 and the interconnect material layer 14 outside the interconnect trench are removed. In these CMP processes, shear stress or perpendicular stress due to mechanical loads is expected to occur. However, the protective insulator 9 that surrounds the first interconnects 5a is formed prior to the CMP processes in the present embodiment. Therefore, the present embodiment makes it possible, by receiving the shear stress and the perpendicular stress with the protective insulator 9, to prevent the first interconnects 5a near the air gaps 7 and the third inter layer dielectric 6 from becoming damaged due to cracks or the like.

These and other stresses also occur in processes other than CMP processes. Examples of such processes include a deposition process and an annealing process. Examples of such stresses include compressive stress and tensile stress. In addition, stress of some sort may also occur in the semiconductor device after the completion of the semiconductor device. The present embodiment makes it possible, by receiving these stresses with the protective insulator 9, to prevent the first interconnects 5a near the air gaps 7 and the third inter layer dielectric 6 from becoming damaged due to the cracks or the like.

Furthermore, in the present embodiment, the Young's modulus of the protective insulator 9 is higher than the Young's modulus of the third inter layer dielectric 6. Therefore, the present embodiment makes it possible to surround the first interconnects 5a with the protective insulator 9 that is higher in strength than the third inter layer dielectric 6 and more effectively prevent damage to the first interconnects 5a and the third inter layer dielectric 6.

Mechanical damage such as the cracks is often generated from the air gaps 7 near the outermost first interconnect 5a or the edge of each first interconnect 5a. Accordingly, the protective insulator 9 is desirably disposed in the vicinity of the outermost first interconnect 5a or the edge of each first interconnect 5a. For this reason, the minimum distance between the side face of the outermost first interconnect 5a and the side face of the protective insulator 9 is set to 100 µm or less. This makes it possible to strengthen portions where the mechanical damage such as the cracks is liable to occur, and to more effectively prevent damage to the first interconnects 5a and the third inter layer dielectric 6.

In addition, the height of the upper end A1 of the protective insulator 9 is set higher than the heights of the upper ends B1 of the first interconnects 5a and the heights of the upper ends C1 of the air gaps 7. Furthermore, the height of the lower end A2 of the protective insulator 9 is set lower than the heights of the lower ends B2 of the first interconnects 5a and the heights of the lower ends C2 of the air gaps 7. Therefore, the present embodiment makes it possible to effectively prevent, with the protective insulator 9, the mechanical damage from occurring in the vicinity of the upper ends B1 of the first interconnects 5a and the upper ends C1 of the air gaps 7 and in the vicinity of the lower ends B2 of the first interconnects 5a and the lower ends C2 of the air gaps 7.

As described above, the semiconductor device of the present embodiment includes the protective insulator 9 that surrounds the interconnect region R including the first interconnects 5a and the air gaps 7 from the lateral sides of the first interconnects 5a through the third inter layer dielectric 6, and is formed of an insulating material different from that of the third inter layer dielectric 6. Therefore, the present embodiment makes it possible to increase the strength of the interconnect structure including the air gaps 7 by the protective insulator 9.

Second Embodiment

Figure 5:
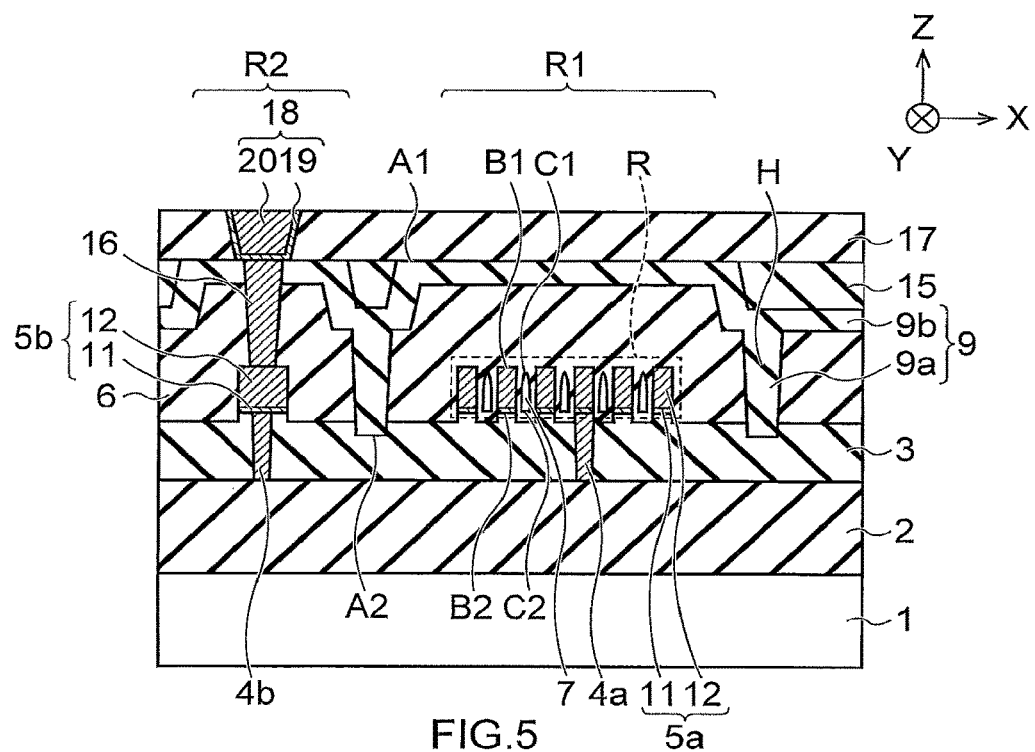
FIG. 5 is a cross-sectional view illustrating a structure of a semiconductor device of a second embodiment.

FIG. 5 is a cross-sectional view illustrating a structure of a semiconductor device of a second embodiment.

The semiconductor device of the present embodiment includes, in addition to the components shown in FIG. 1A, a fourth inter layer dielectric 15, a third via plug 16, a fifth inter layer dielectric 17 and a fourth interconnect 18. The third interconnect 8 of the first embodiment is replaced with the third via plug 16 and the fourth interconnect 18 in the present embodiment. The semiconductor device of the present embodiment further includes a barrier metal layer 19 and an interconnect material layer 20 that form the fourth interconnect 18.

In addition, the protective insulator 9 of the present embodiment includes the exterior wall portion 9a that has an annular shape and surrounds the interconnect region R from the lateral sides of the first interconnects 5a, and the roof portion 9b that is formed above the interconnect region R through the third inter layer dielectric 6. The exterior wall portion 9a and the roof portion 9b are examples of the first and second portions, respectively. The exterior wall portion 9a and the roof portion 9b are formed of a silicon nitride and coupled with each other. The protective insulator 9 of the present embodiment covers the first interconnects 5a like a dome by the exterior wall portion 9a and the roof portion 9b.

The fourth inter layer dielectric 15 is formed on the exterior wall portion 9a and the roof portion 9b of the protective insulator 9. An example of the fourth inter layer dielectric 15 includes a silicon oxide.

The third via plug 16 is formed on the second interconnect 5b in the third inter layer dielectric 6 and the protective insulator 9, and is electrically connected to the second interconnect 5b. The third via plug 16 is formed of, for example, a tungsten layer.

The fifth inter layer dielectric 17 is formed on the protective insulator 9 and the fourth inter layer dielectric 15. An example of the fifth inter layer dielectric 17 includes a silicon oxide.

The fourth interconnect 18 is formed on the third via plug 16 in the fifth inter layer dielectric 17, and is electrically connected to the third via plug 16. The fourth interconnect 18 of the present embodiment is a single-damascene interconnect formed by a single damascene method. The fourth interconnect 18 is formed of the barrier metal layer 19 and the interconnect material layer 20 on the barrier metal layer 19. An example of the barrier metal layer 19 includes a titanium layer. An example of the interconnect material layer 20 includes a copper layer.

For example, the dimensions of the semiconductor device of the present embodiment are set to the same values as those in the first embodiment, except the dimensions mentioned below. The thickness of the third inter layer dielectric 6 is 90 nm. The thickness of the roof portion 9b is 25 nm, and the total thickness of the exterior wall portion 9a and the roof portion 9b is 140 nm. The width of the fourth interconnect 18 is 70 nm, and the thickness of the fourth interconnect 18 is 55 nm.

The above mentioned dimensions and materials are examples only, and the semiconductor device of the present embodiment may be configured by applying dimensions and materials other than those mentioned above.

FIGS. 6A to 7B are cross-sectional views illustrating a method of manufacturing the semiconductor device of the second embodiment. In FIGS. 6A to 7B, the substrate 1 and the first inter layer dielectric 2 are excluded from the illustrations.

First, the processes in FIGS. 2A, 2B and 3A are carried out. However, the thickness of the third inter layer dielectric 6 is set to 90 nm, and the depth of the trench H is set to 115 nm.

Figure 6A:
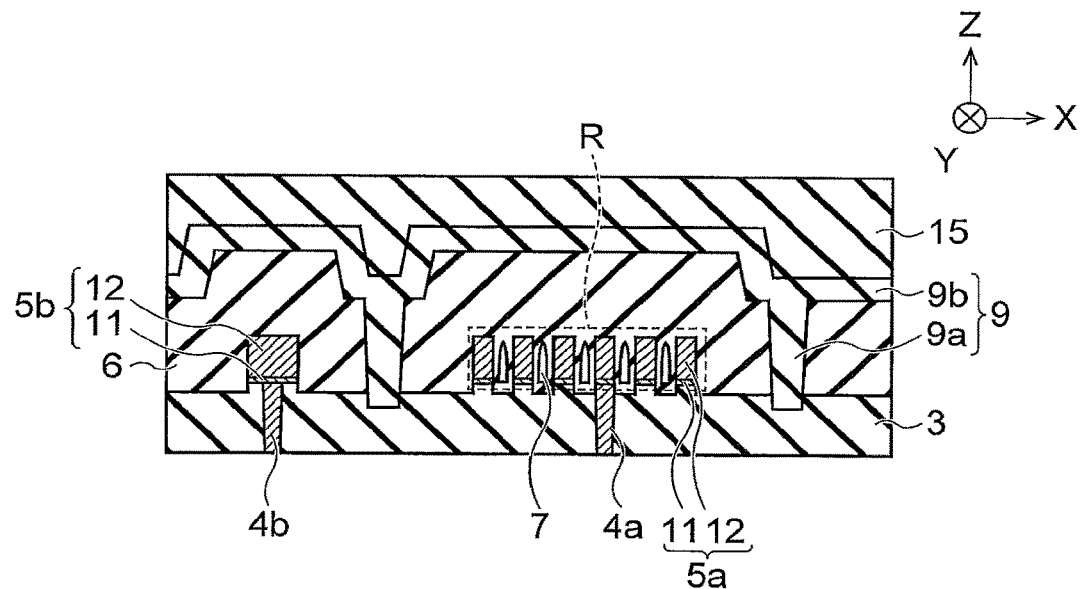
FIGS. 6A to 7B are cross-sectional views illustrating a method of manufacturing the semiconductor device of the second embodiment.
Figure 6B:
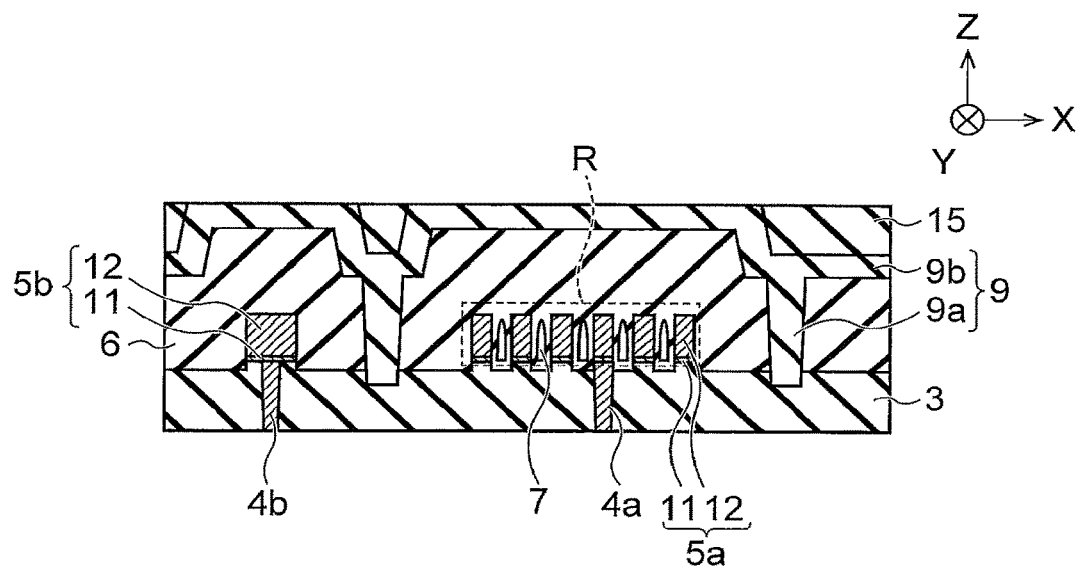

Next, the fourth inter layer dielectric 15 is formed on the exterior wall portion 9a and the roof portion 9b of the protective insulator 9 (FIG. 6A). Next, the fourth inter layer dielectric 15 is polished by CMP using the protective insulator 9 as a stopper to planarize a surface of the fourth inter layer dielectric 15 (FIG. 6B). As a result, a portion of the fourth inter layer dielectric 15 is removed, and a remaining portion of the fourth inter layer dielectric 15 is left in concave portions of the protective insulator 9. The fourth inter layer dielectric 15 is an example of a film above the substrate and a third film.

Figure 7A:
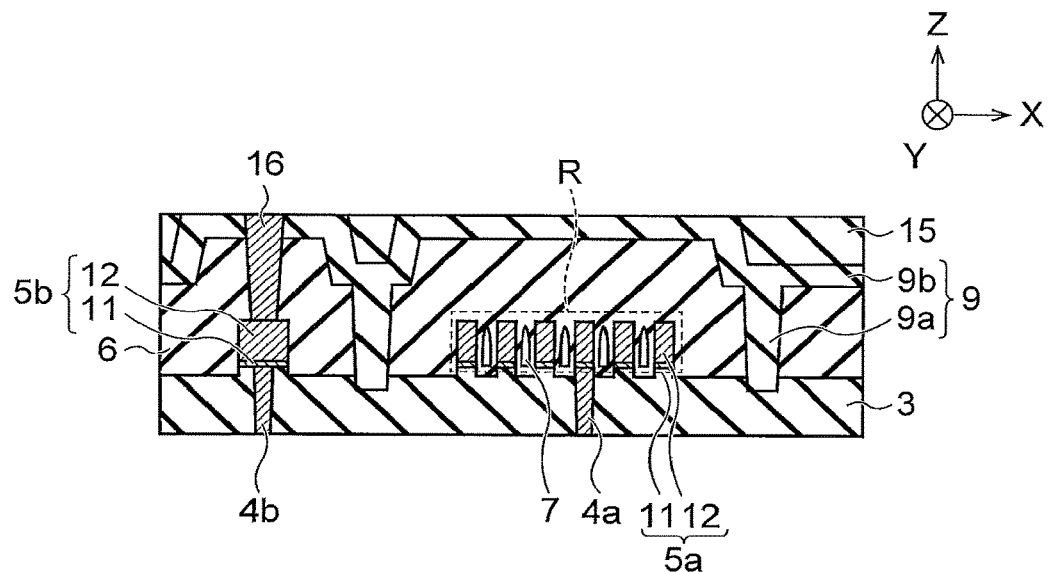
Figure 7B:
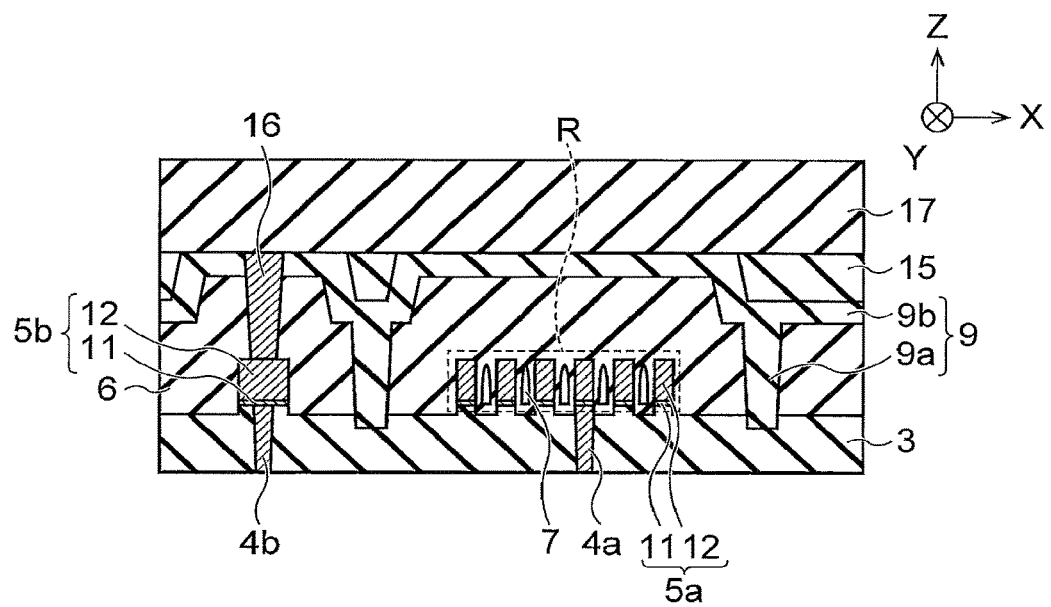

Next, the protective insulator 9 and the third inter layer dielectric 6 are processed by RIE to form a via hole on the second interconnect 5b. Next, a plug material of the third via plug 16 is formed in the via hole by sputtering and portions of the plug material outside the via hole are removed by CMP. As a result, the third via plug 16 is formed on the second interconnect 5b (FIG. 7A). This plug material is an example of the film above the substrate and the third film. Next, the fifth inter layer dielectric 17 is formed on the protective insulator 9 and the fourth inter layer dielectric 15 (FIG. 7B).

Thereafter, the fifth inter layer dielectric 17 is processed by RIE to form an interconnect trench on the third via plug 16. Next, the barrier metal layer 19 is formed on the bottom and side faces of the interconnect trench by sputtering, the interconnect material layer 20 is formed inside the interconnect trench by plating, and portions of the barrier metal layer 19 and the interconnect material layer 20 outside the interconnect trench are removed by CMP. As a result, the fourth interconnect 18 is formed on the third via plug 16 (FIG. 5). The barrier metal layer 19 and the interconnect material layer 20 are an example of the film above the substrate and the third film. In this way, the semiconductor device of the present embodiment is manufactured.

Hereinafter, details on the semiconductor device of the present embodiment will be described with reference to FIG. 5.

In the present embodiment, CMP processes are carried out when the surface of the fourth inter layer dielectric 15 is planarized, when the portions of the plug material outside the via hole are removed, and when the portions of the barrier metal layer 19 and the interconnect material layer 20 outside the interconnect trench are removed. In these CMP processes, shear stress or perpendicular stress due to mechanical loads is expected to occur. However, in the present embodiment, the protective insulator 9 including the exterior wall portion 9a and the roof portion 9b is formed prior to these CMP processes. Therefore, the present embodiment makes it possible, by receiving the shear stress and the perpendicular stress with the protective insulator 9 more effectively than that of the first embodiment, to more effectively prevent the first interconnects 5a near the air gaps 7 and the third inter layer dielectric 6 from becoming damaged due to the cracks or the like.

These and other stresses also occur in processes other than CMP processes. Examples of such processes include a deposition process and an annealing process. Examples of such stresses include compressive stress and tensile stress. In addition, stress of some sort may also occur in the semiconductor device after the completion of the semiconductor device. The present embodiment makes it possible, by receiving these stresses with the exterior wall portion 9a and the roof portion 9b, to more effectively prevent the first interconnects 5a near the air gaps 7 and the third inter layer dielectric 6 from becoming damaged due to the cracks or the like.

As described above, the semiconductor device of the present embodiment includes the protective insulator 9 that includes the exterior wall portion 9a having an annular shape and surrounding the interconnect region R from the lateral sides of the first interconnects 5a, and the roof portion 9b formed above the interconnect region R through the third inter layer dielectric 6, and is formed of an insulating material different from that of the third inter layer dielectric 6. That is, the protective insulator 9 of the present embodiment includes the roof portion 9b in addition to the exterior wall portion 9a. Therefore, the present embodiment makes it possible to more effectively increase the strength of the interconnect structure including the air gaps 7 by the protective insulator 9.

On the other hand, the first embodiment has an advantage that, for example, the structure and the manufacturing process of the semiconductor device can be easily simplified, compared the second embodiment. For example, the third interconnect 8 of the first embodiment can be formed with a smaller number of steps, compared with the third via plug 16 and the fourth interconnect 18 of the second embodiment.

The protective insulator 9 of the first and second embodiments may be replaced with a film other than an insulator, as long as it is possible to increase the strength of the interconnect structure including the air gaps 7. For example, the protective insulator 9 of the first and second embodiments may be replaced with a conductor film or a semiconductor film that can increase the strength of the interconnect structure including the air gaps 7.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   interconnects provided above the substrate;
   a first insulator that is provided on the interconnects and on air gaps provided between the interconnects, surrounds the interconnects from lateral sides of the interconnects, and is formed of a first insulating material; and
   a second insulator that surrounds an interconnect region including the interconnects and the air gaps from the lateral sides of the interconnects through the first insulator, includes no portion provided between the interconnects, and is formed of a second insulating material different from the first insulating material.

2. The device of claim 1, wherein a Young's modulus of the second insulator is higher than a Young's modulus of the first insulator.

3. The device of claim 1, wherein the second insulator comprises at least one of a silicon nitride, a silicon carbide, an aluminum oxide, and an aluminum nitride.

4. The device of claim 1, wherein
a height of an upper end of the second insulator is higher than heights of upper ends of the interconnects and heights of upper ends of the air gaps, and
a height of an lower end of the second insulator is lower than heights of lower ends of the interconnects and heights of lower ends of the air gaps.

5. The device of claim 1, wherein a minimum distance between a side face of an outermost interconnect in the interconnect region and a side face of the second insulator is 100 µm or less.

6. The device of claim 1, wherein the second insulator comprises a first portion having an annular shape that surrounds the interconnect region from the lateral sides of the interconnects.

7. The device of claim 6, wherein the first portion has a quadrangular annular shape.

8. The device of claim 6, wherein the second insulator further comprises a second portion provided above the interconnect region through the first insulator.

9. The device of claim 6, wherein a region on the substrate comprises:
a first region that overlaps with an inner region of the first portion in a direction that is perpendicular to a surface of the substrate; and
a second region that overlaps with an outer region of the first portion in the direction that is perpendicular to the surface of the substrate,
wherein the device further comprises an element or an interconnect provided in the second region.

* * * * *